(12) United States Patent
Jonda et al.

(10) Patent No.: US 7,592,194 B2
(45) Date of Patent: Sep. 22, 2009

(54) RADIATION-EMITTING AND/OR -RECEIVING SEMICONDUCTOR COMPONENT AND METHOD FOR THE PATTERNED APPLICATION OF A CONTACT TO A SEMICONDUCTOR BODY

(75) Inventors: Christoph Jonda, Regenstauf (DE); Ulrich Zehnder, Regensburg (DE); Uwe Strauss, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/120,382

(22) Filed: May 2, 2005

(65) Prior Publication Data

US 2005/0255614 A1 Nov. 17, 2005

(30) Foreign Application Priority Data

Apr. 30, 2004 (DE) .................. 10 2004 021 420
Aug. 4, 2004 (DE) .................. 10 2004 037 868

(51) Int. Cl.
*H01L 21/00* (2006.01)

(52) U.S. Cl. ........................... 438/46; 438/98

(58) Field of Classification Search ............. 438/45–47, 438/93–94, 98
See application file for complete search history.

(56) References Cited

U.S. PATENT DOCUMENTS

| | | | |
|---|---|---|---|
| 4,860,069 A | 8/1989 | Yamazaki | |
| 5,189,496 A | 2/1993 | Kuwabara | |
| 5,612,231 A * | 3/1997 | Holm et al. | 438/23 |
| 5,814,533 A * | 9/1998 | Shakuda | 438/46 |
| 5,972,731 A * | 10/1999 | Dutta | 438/39 |
| 6,228,673 B1 * | 5/2001 | Loo et al. | 438/57 |
| 6,316,792 B1 | 11/2001 | Okazaki et al. | |
| 6,603,146 B1 | 8/2003 | Hata et al. | |
| 6,846,686 B2 * | 1/2005 | Saeki et al. | 438/22 |
| 2003/0207480 A1 * | 11/2003 | Kobayashi et al. | 438/22 |
| 2004/0056254 A1 * | 3/2004 | Bader et al. | 257/79 |
| 2004/0063236 A1 * | 4/2004 | Kwak et al. | 438/39 |
| 2004/0114652 A1 * | 6/2004 | Yoshikawa | 372/46 |
| 2004/0185599 A1 * | 9/2004 | Harle et al. | 438/98 |
| 2004/0188702 A1 * | 9/2004 | Bruderl et al. | 257/103 |
| 2004/0222434 A1 | 11/2004 | Uemura et al. | |

(Continued)

FOREIGN PATENT DOCUMENTS

DE 199 21 987 A1 11/1999

(Continued)

OTHER PUBLICATIONS

Search Report dated Oct. 9, 2007 issued for the corresponding European Patent Appplication No. 05 00 4952.

*Primary Examiner*—Richard A. Booth
(74) *Attorney, Agent, or Firm*—Cohen Pontani Lieberman & Pavane LLP

(57) ABSTRACT

A radiation-emitting and/or -receiving semiconductor component comprising a semiconductor body (1), which has an active zone (2) provided for radiation generation or for radiation reception, a lateral main direction of extent and a main area, and also a protective layer (6) arranged on the main area and a contact (5) arranged on the main area, the protective layer (6) being spaced apart from the contact in the lateral direction. A method for the application of a contact to a semiconductor body (1) is also disclosed.

11 Claims, 3 Drawing Sheets

U.S. PATENT DOCUMENTS

2004/0248334 A1* 12/2004 Hoss et al. .................... 438/39
2005/0019971 A1* 1/2005 Slater et al. ................... 438/33
2005/0072982 A1 4/2005 Strauss et al.
2005/0196887 A1* 9/2005 Liu ............................. 438/22
2005/0285127 A1* 12/2005 Noto et al. .................... 257/96

FOREIGN PATENT DOCUMENTS

| | | |
|---|---|---|
| DE | 101 52 922 A1 | 5/2003 |
| JP | 58 14 2583 | 8/1983 |
| JP | 60 06 6880 | 4/1985 |
| WO | WO 02/075819 A2 | 9/2002 |
| WO | WO 03/038913 A2 | 5/2003 |

* cited by examiner

RADIATION-EMITTING AND/OR
-RECEIVING SEMICONDUCTOR
COMPONENT AND METHOD FOR THE
PATTERNED APPLICATION OF A CONTACT
TO A SEMICONDUCTOR BODY

RELATED APPLICATIONS

This patent application claims the priorities of German patent applications 102004021420.4 of Apr. 30, 2004 and 102004037868.1 of Aug. 4, 2004, the disclosure content of which is hereby incorporated by reference in the present patent application.

FIELD OF THE INVENTION

The invention relates to a radiation-emitting and/or -receiving semiconductor component, comprising a semiconductor body, which has an active zone intended for radiation generation or for radiation reception, a lateral main direction of extent and a main area, and also a protective layer arranged on the main area and a contact arranged on the main area, and to a method for the patterned application of a contact to such a semiconductor body.

BACKGROUND OF THE INVENTION

Published U.S. patent application No. 2005/0072982 describes a semiconductor component of the generic type. In accordance with FIG. 1 therein, a semiconductor body is arranged on a substrate. A contact is arranged on the semiconductor body. A protective layer is furthermore provided which extends as far as to that side of the contact which is opposite to the semiconductor body, and is arranged on said side.

Changes in temperature such as occur for example when the contact is connected to a bonding wire or during operation of the semiconductor component may cause the protective layer to chip off from the contact and/or the semiconductor body on account of the often different coefficients of thermal expansion of the materials of the contact and the protective layer. Such chipping off may have an efficiency-reducing effect on the function of the semiconductor component.

The protective layer may also be caused to chip off by mechanical loading. By way of example, when a bonding wire is arranged on the contact, the protective layer may chip off from the contact and/or the semiconductor body or a cavity may form between the protective layer and the semiconductor body. The protective layer is particularly sensitive to mechanical loading on that side of the contact which is opposite to the semiconductor body and at the sidewalls of the contact.

Because of the often high difference in refractive index between air and the material of the semiconductor body, the efficiency of the semiconductor component—particularly regarding the coupling in of radiation and the coupling out of radiation—may be reduced as a result of the protective layer chipping off.

In order to produce the contact, by way of example, firstly the semiconductor body is covered with the contact material over the whole area. Said contact material is subsequently patterned by means of a conventional mask technique in the form of the contact. The protective layer is thereupon applied to the contact and the semiconductor body and, in a subsequent second mask step, the protective layer is opened in partial regions above the contact by means of a further conventional mask technique in order to enable the contact to be connected with a bonding wire.

SUMMARY OF THE INVENTION

One object of the invention is to provide an improved radiation-emitting and/or -receiving semiconductor component.

Another object of the invention is to provide a simplified method for the application of a contact to a semiconductor body.

These and other objects are attained in accordance with one aspect of the present invention directed to a radiation-emitting and/or -receiving semiconductor component having a semiconductor body, which has an active zone intended for radiation generation or for radiation reception, a lateral main direction of extent and a main area. A protective layer is arranged on the part of the main area and a contact is arranged on the part of the main area, the protective layer being spaced apart from the contact in the lateral direction.

The spaced-apart arrangement of protective layer and contact reduces the risk of the protective layer being stripped away from the contact in thermally governed fashion and increases the efficiency of the semiconductor component.

Preferably, the distance between the protective layer and the contact in the lateral direction is large enough in relation to the coefficient of thermal expansion of the contact to prevent the protective layer from being touched due to the thermal expansion of the contact during operation or when the contact is connected to a bonding wire.

Particularly preferably, the contact is spaced apart altogether from the protective layer, so that the contact and the protective layer do not touch each other. A freespace is expediently formed between contact and protective layer for this purpose.

Furthermore, the spacing between the protective layer and the contact is preferably kept as small as possible in order that the risk of damage to the semiconductor component on account of a lack of protective layer in the region between the contact and the protective layer is not increased unnecessarily. A spacing of less than or equal to 45 µm, preferably less than or equal to 25 µm, particularly preferably less than or equal to 10 µm, and greater than or equal to 0.5 µm, preferably greater than or equal to 1 µm, particularly preferably greater than or equal to 5 µm, may be regarded as sufficient.

In particular, the spacing between contact and protective layer is preferably less than half of a lateral extent of a contact area of the contact with a bonding wire said contact area being formed when the contact is connected to a bonding wire. Typical magnitudes for the extent of the contact area are 90 µm to 50 µm, by way of example. The risk of the protective layer chipping away from the semiconductor body in mechanically governed fashion can thereby be reduced more extensively.

In one refinement of the invention, a thickness of the protective layer at least on the part of the main area is less than a thickness of the contact. An elevation of the protective layer above that side of the contact which is opposite to the semiconductor body can thus be avoided. As a consequence, the risk of the protective layer chipping away from the semiconductor body, in particular chipping away in mechanically governed fashion, for instance when the contact is connected to a bonding wire, is reduced more extensively.

In a further refinement of the invention, the protective layer on the part of the main area of the semiconductor body runs in essentially plane fashion, thereby reducing the risk of chipping off more extensively.

The semiconductor body may be formed for example in accordance with a luminescence diode or a photodiode. In accordance with one refinement of the invention, the semiconductor body, in particular the active zone, contains at least one III-V semiconductor material, for instance a material from the material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$. In this case, $In_xGa_yAl_{1-x-y}P$ is particularly suitable for example for radiation from the infrared to the yellow spectral region and $In_xGa_yAl_{1-x-y}N$ is particularly suitable for radiation from the green through to the ultraviolet spectral region. III-V semiconductor materials, in particular those mentioned above, may be distinguished by an advantageously high internal quantum efficiency.

Another aspect of the invention is directed to a method for the patterned application of a contact to a semiconductor body, which has an active zone intended for radiation generation or for radiation reception, a lateral main direction of extent and a main area, featuring the steps of a) providing the semiconductor body, b) applying a protective layer on part of the main area to the semiconductor body, c) removing the protective layer on part of the main area of the semiconductor body in a contact region, and d) arranging at least one contact material for the contact in the contact region.

After the semiconductor body has been provided, a protective layer is applied on the part of the main area to the semiconductor body, preferably over the whole area. Said protective layer advantageously protects the semiconductor body against harmful external influences.

The protective layer can be formed in radiation-transmissive and/or electrically insulating fashion. This makes it possible to avoid a short circuit of the active zone via the material of the protective layer. In particular, this holds true if the protective layer is at least partly formed around the semiconductor body and/or adjoins the latter in the region of the active zone.

In one refinement of the invention, the protective layer contains a silicon nitride, a silicon oxide or a silicon oxynitride.

The protective layer may be applied for example by means of a plasma process.

This is followed by the removal of the protective layer on the part of the main area of the semiconductor body in a contact region, whereupon at least one contact material for the contact is arranged in the contact region.

The fact that the protective layer is applied before the contact material or the contact reduces the risk of damage to the semiconductor body or structures arranged on that side of the protective layer which faces the semiconductor body as a result of the application of the contact material and patterning methods for applying the contact material. Furthermore, the protection of the semiconductor body during further processing is advantageously increased.

Prior to the removal of the protective layer in the contact region, in accordance with one preferred refinement of the invention, a mask is arranged on or formed over the protective layer, the structure of said mask determining the lateral dimensioning of the contact region. The mask may be arranged in patterned fashion on the protective layer or be correspondingly patterned after arrangement. The mask preferably contains a photopatternable material, such as a photoresist that is exposed and developed in accordance with the mask structure.

In accordance with one advantageous development of the invention, the mask determines, by way of its structure, the lateral dimensioning of the contact, which is preferably arranged by vapor deposition of at least one contact material on the part of the main area of the semiconductor body in the contact region.

The same mask as is used for forming the contact may thus advantageously be used for removing the protective layer in the contact region. A complicated additional masking step can be avoided.

In a further refinement of the invention, the contact material is arranged in the contact region in such a way that a contact is formed which has a larger thickness compared with the protective layer. An elevation of the protective layer above that side of the contact which is remote from the semiconductor body can thus be avoided.

The contact may, if appropriate, overlap the protective layer on that side of the latter which is remote from the semiconductor body. In particular, the protective layer may adjoin the contact, for instance in the lateral direction. An overlap between the contact and the protective layer on that side of the contact which is remote from the semiconductor body is advantageously avoided, however, through application of the contact material after the protective layer.

Furthermore, the protective layer can be arranged in essentially plane fashion on the main area of the semiconductor body and, in particular, does not extend in the vertical direction along the contact in the direction of that side of the contact which is opposite to the semiconductor body.

In a further refinement of the invention, the contact applied in accordance with the method according to the invention is spaced apart from the protective layer in the lateral direction. For this purpose, by way of example, a contact region may be provided which takes up an enlarged lateral area compared with the area of the contact on the part of the main area of the semiconductor body.

In accordance with a further refinement, the protective layer is removed in the contact region in such a way that the protective layer is also removed in a region that lies below the mask structure or is shaded by the latter. A wet-chemical etching method is preferably used for this purpose, which can effect an undercut or underetch of the mask structure and thus facilitate the formation of a contact region with an area that is larger than the area of the contact on the part of the semiconductor body.

The method can be used for forming a contact for the above-mentioned semiconductor component, so that the features relating to the method which are described above and below may also be used for the semiconductor component, and vice versa.

In a further refinement of the invention, a current expansion layer is arranged on the semiconductor body. Said current expansion layer is preferably arranged between the protective layer and the semiconductor body and/or electrically conductively connected to the contact.

A current expansion layer of this type can advantageously improve the impressing of current into the semiconductor body, in particular from the side of the contact. Particularly preferably, the current expansion layer has a transverse conductivity—conductivity in the lateral direction—which is greater than that of the semiconductor material arranged in the semiconductor body on the part of the contact. The energized area of the active zone in the semiconductor body, i.e. the area of the active zone into which current is injected, and hence the efficiency of the semiconductor component can thus advantageously be increased. Suitable materials having high transverse conductivity are for example metals or TCO materials (TCO: Transparent Conducting Oxide), such as ZnO, SnO, TiO or ITO, in which case TCO materials, in addition to high transverse conductivity, may also be distinguished by high radiation transmissivity over a wide wavelength range. TCO-containing current expansion layers may be sputtered onto the semiconductor body, by way of example, and metal-containing current expansion layers are vapor-deposited or sputtered onto the semiconductor body.

In accordance with one development of the invention, the current expansion layer comprises a semitransparent, preferably metal-containing, layer. In this case, semitransparent means that only a comparatively small, tolerable proportion of radiation that is incident on the semiconductor body or generated in the semiconductor body is absorbed in the current expansion layer. For this purpose, the current expansion layer is expediently made comparatively thin, for instance having thicknesses of between 50 nm and 1 nm inclusive, preferably between 25 nm and 2 nm inclusive. Thicknesses of 15 nm or less have proven to be particularly advantageous. By way of example, the current expansion layer contains Pt, Pd, Ni, Au or an alloy with at least one of said materials, such as NiAu.

The protective layer reduces the risk of damage to the current expansion layer, in particular a comparatively scratch-sensitive semitransparent current expansion layer.

The protective layer can be formed as an antiscratch layer that is stabler with respect to mechanical loading, such as scratches, than the current expansion layer. The risk of large-area scratches that can, in particular electrically, separate entire segments of the current expansion layer is thus reduced.

The current expansion layer may be applied to the semiconductor body prior to the protective layer and is thus already protected by the protective layer during the application of the contact.

In particular, this prevents the mask material that is used during the application of the contact from getting directly onto the current expansion layer to a large extent. The risk of residues of the mask material after the removal of the mask structure on the current expansion layer is consequently reduced. Mask material residues in general can have an efficiency-reducing effect on semiconductor components in that, by way of example, they may cause scratches, absorb radiation or, on account of their often nonconductive properties, in particular in the case of an arrangement between the contact and the current expansion layer, reduce the efficiency of the introduction of current into the active zone.

In conventional semiconductor components, the damage to the current expansion layer due to scratches caused by mask material residues is often accepted or the residues are eliminated by complicated cleaning methods. However, the cleaning methods suitable for this purpose may in turn have a harmful effect on the current expansion layer, in particular a semitransparent one. Furthermore, such a cleaning method may have a harmful effect on the semiconductor body, in particular on GaN-based and/or p-conducting semiconductor materials. A disadvantageous increase in the forward voltage of the semiconductor component, for example, may occur as a consequence. In the case of an embodiment of the invention, by contrast, the current expansion layer is protected from the residues to the greatest possible extent by the protective layer. Cleaning of the current expansion layer can thus be avoided.

During the removal of the mask, for example by means of etching, the protective layer may additionally serve as a barrier layer which reduces the risk of damage to the current expansion layer due to the processes for removing the mask.

In one refinement of the invention, the contact and/or the protective layer spaced apart from the contact is arranged on a p-conducting side of the semiconductor body. Particularly preferably, the current expansion layer is also arranged on the p-conducting side of the semiconductor body.

DETAILED DESCRIPTION OF THE DRAWINGS

Elements that are of identical type and act identically are provided with the same reference symbols in the figures.

FIGS. 1A to 1G show an exemplary embodiment of a method according to the invention for the patterned application of a contact to a semiconductor body on the basis of intermediate steps illustrated schematically. In particular, a method is shown for the patterned application of a contact to a plurality of semiconductor bodies which can be carried out in the wafer assembly.

As regards the invention, a wafer assembly is to be understood as a semiconductor layer sequence which is arranged on a carrier layer and is intended for the formation of a plurality of semiconductor bodies. The carrier layer is preferably self-supporting and may comprise the growth substrate on which the semiconductor layer sequence has been grown, for example epitaxially, or a layer which is different from the growth substrate of the semiconductor layer sequence and on which the semiconductor layer sequence is arranged in the course of its processing in the wafer assembly. The semiconductor layer sequence can be arranged and/or fixed on the last-mentioned carrier layer—different from the growth substrate—for example by means of an adhesive-bonding connection, a soldering connection or a wafer bonding method.

Figure 1A:
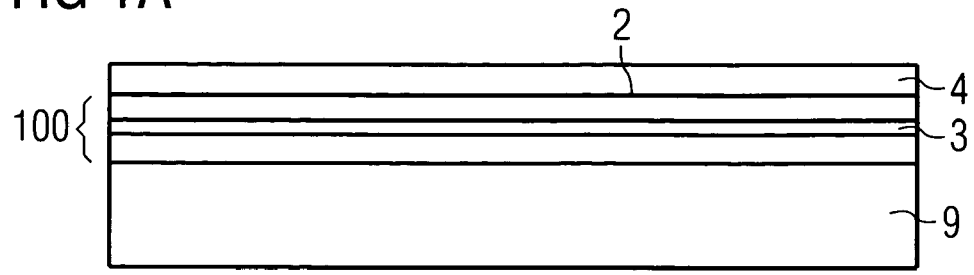
FIGS. 1A to 1G show sectional views that schematically illustrate intermediate steps of an exemplary embodiment of a method according to the invention.
Figure 1B:
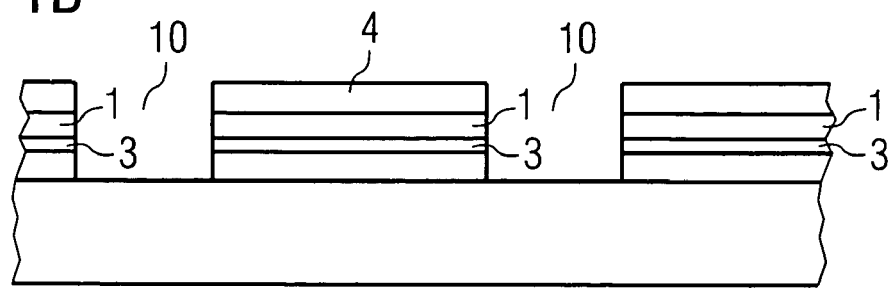

In FIG. 1A, a semiconductor layer sequence 100 having a main area 2 and an active zone 3 is arranged on a carrier layer 9. Main area 2 is substantially the entire upper surface of layer sequence 100. The carrier layer 9 may comprise the growth substrate of the semiconductor layer sequence, for example made of SiC, sapphire or GaN in the case of semiconductor layer sequences based on the material system $In_xGa_yAl_{1-x-y}N$.

The current expansion layer 4, arranged on the main area 2 of the semiconductor layer sequence, is preferably applied after the production of the semi-conductor layer sequence, for instance by means of vapor deposition in the wafer assembly, has a thickness of approximately 5 nm and/or is composed of Pt. Preferably, the semiconductor layer sequence is p-conducting on the side of the current expansion layer. Pt is distinguished by advantageous contact properties, in particular with respect to GaN-based and/or p-conducting semiconductor materials.

The active zone may comprise, for example, a single or a multiple quantum well structure or a heterostructure, for instance a double heterostructure.

Afterward, from the side opposite to the carrier layer, the semiconductor layer sequence is patterned, for example by means of masking processes—e.g. by means of a photoresist mask—in combination with etching processes, in such a way that a plurality of semiconductor bodies 1, preferably of identical type, arise which are arranged on the carrier layer and are spatially separated from one another by interspaces 10.

In order to reduce the risk of damage to the (scratch-) sensitive current expansion layer 4 during the masking process, an intermediate layer, for example containing Au, may be provided in this case between the mask material and the current expansion layer which intermediate layer is removed again after the patterning of the semiconductor layer sequence together with the mask structure in a manner that is not harmful to the current expansion layer. The structure that emerges from this patterning process is illustrated schematically on the basis of a sectional view in FIG. 1B.

Afterward, a radiation-transmissive, electrically insulating protective layer, for example made of SiON, is applied on the part of the semiconductor bodies, preferably over the whole area. The protective layer 6 is formed around the semiconductor bodies preferably on all sides, is also preferably arranged in the region of the interspaces 10 and/or in contact with the carrier layer. Said protective layer protects the semiconductor body against harmful external influences, in particular at the lateral sidewalls, and also acts as a protective layer for the current expansion layer 4, during the further processing of the structure illustrated on the basis of a schematic sectional view in FIG. 1C. The protective layer is preferably distinguished by an increased electrical breakdown strength compared with adjoining media, for instance air. The risk of a short circuit of the active zone is thus reduced.

The protective layer may be applied for example by means of a plasma process.

A mask structure 11 is thereupon applied to the protective layer 6. The mask structure is preferably configured in such a way that it has cutouts 12 above those regions of the semiconductor bodies 1 which are intended for the formation of the contact.

Figure 1C:
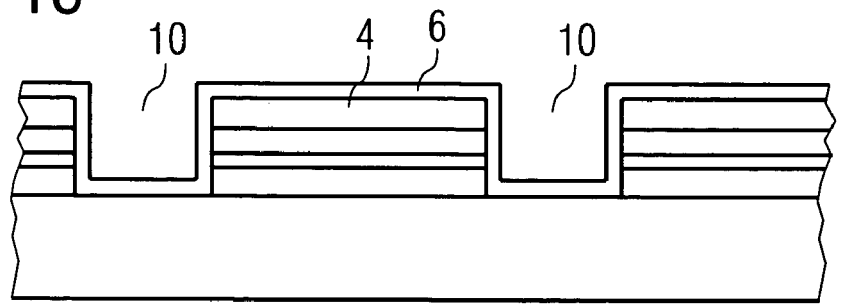

In order to form the mask structure, a mask material may firstly be applied to the structure shown in FIG. 1C over the whole area and subsequently be patterned in accordance with the mask structure or the mask material may be applied in already patterned fashion.

In the first case, for this purpose the mask material, e.g. a photoresist, is applied in layered fashion and exposed and developed in accordance with the mask structure. Residues of the mask material that possibly remain in the region of the bottom of the cutout 12, said bottom in this case being formed by the protective layer 6, can be removed by means of a suitable method. By way of example, a gas-assisted method, such as a so-called $N_2O$ flash, may thus be used. In this case, the semiconductor bodies 1 and/or the current expansion layer 4 are respectively protected against the possibly harmful effects of this removal method by means of the protective layer 6.

Figure 1D:
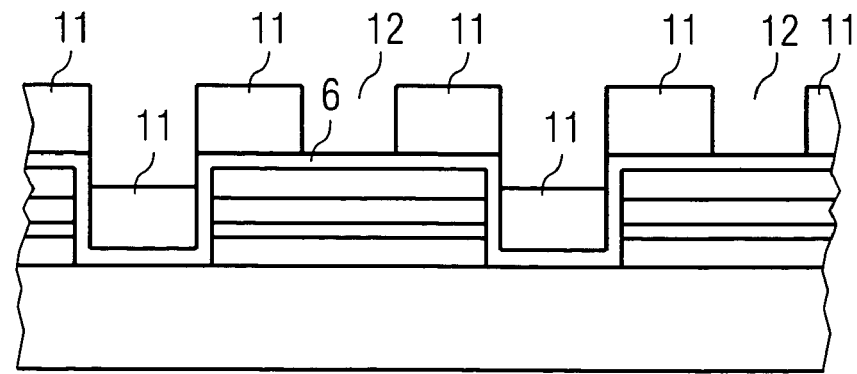

The mask structure 11 with the cutouts 12 reaching down to the protective layer 6 is illustrated schematically on the basis of a sectional view in FIG. 1D.

The protective layer 6 is subsequently removed in contact regions 13. This may be done for example by means of wet-chemical etching, for instance using HF. Preferably, the contact region 13 is made wider in sectional view than the structure defined by the bottom of the cutout 12, which may be effected by undercutting or underetching the mask structure in the lateral direction in regions that are shaded or covered by said mask structure.

Figure 1E:
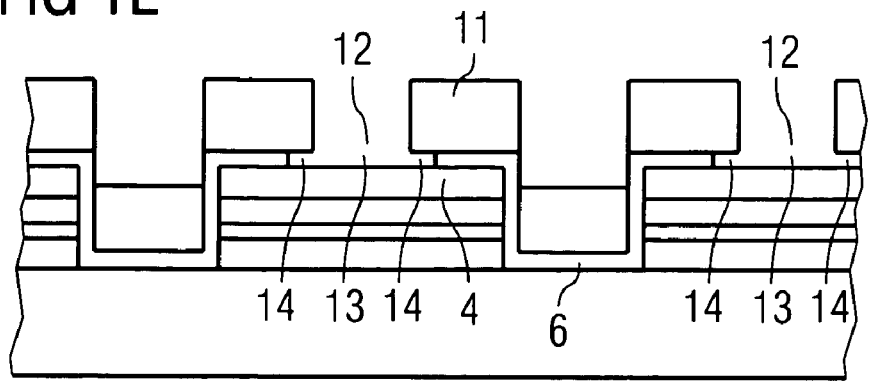

The structure that emerges from this is illustrated schematically on the basis of a sectional view in FIG. 1E. The protective layer 6 has been removed from the current expansion layers 4 in contact regions 13 and the mask structure 11 projects over the contact region 13 in partial regions 14. The cutout and the contact region may have an essentially circular shape in plan view, by way of example. The lateral dimensions of the contact regions are preferably smaller than those of the semiconductor bodies or of the current expansion layers 4 and those of the cutouts 12 are in turn smaller than those of the contact regions 13.

At least one contact material is subsequently applied to the structure shown in FIG. 1E, preferably over the whole area, in such a way that the contact material is in each case conductively connected to the current expansion layer 4 and thus the active zone 3 in the contact region.

In this exemplary embodiment, two different contact materials in the form of two contact layers 52, 53 are successively applied to the structure shown in FIG. 1E. Preferably, both contact layers contain at least one metal or alloys and/or are applied by vapor deposition. The contact layer 52 applied first is particularly preferably distinguished by good electrical contact properties with respect to the material of the current expansion layer 4. The material of the contact layer 52 may be e.g. identical to that of the current expansion layer 4, for instance Pt. The contact layer 53 applied afterward is particularly preferably distinguished by good properties with regard to a wire bonding process carried out later (conductive connection of the contact to a bonding wire) and contains Au by way of example. Overall, it is thus possible to produce an advantageously low-impedance electrical contact to the semiconductor body.

The first contact layer 52 and the second contact layer 53, in the contact regions 13, are in each case part of a contact 5 for the semiconductor bodies 1. This is illustrated on the basis of a schematic sectional view in FIG. 1F. In the case of a method according to the invention, the mask structure 11 can accordingly be used both as a mask for removing the protective layer in regions and as a mask for applying a contact to the semiconductor body. The number of masking steps is advantageously reduced compared with conventional methods. Furthermore, the method can advantageously be carried out in the wafer assembly.

Figure 1F:
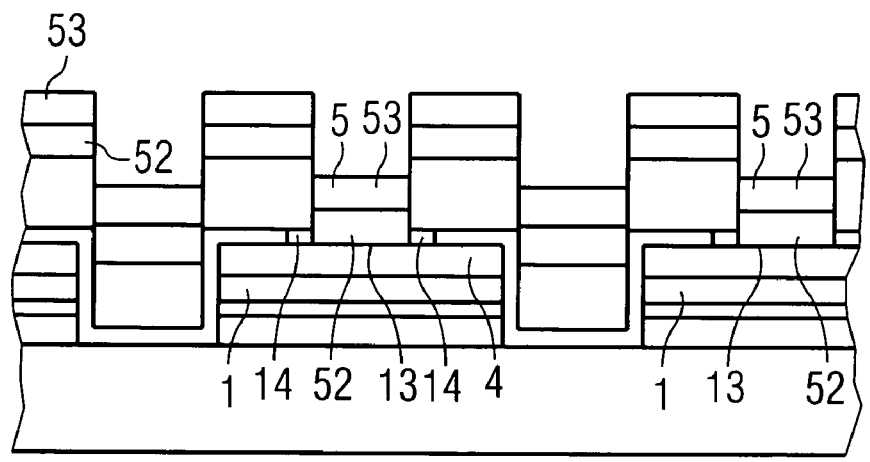

The mask structure with the contact materials situated thereon can subsequently be removed from the structure shown in FIG. 1F, as is customary in a lift-off process of this type. In this case, the protective layer 6 acts as a barrier layer protecting the current expansion layers 4 and the semiconductor bodies 1.

Figure 1G:
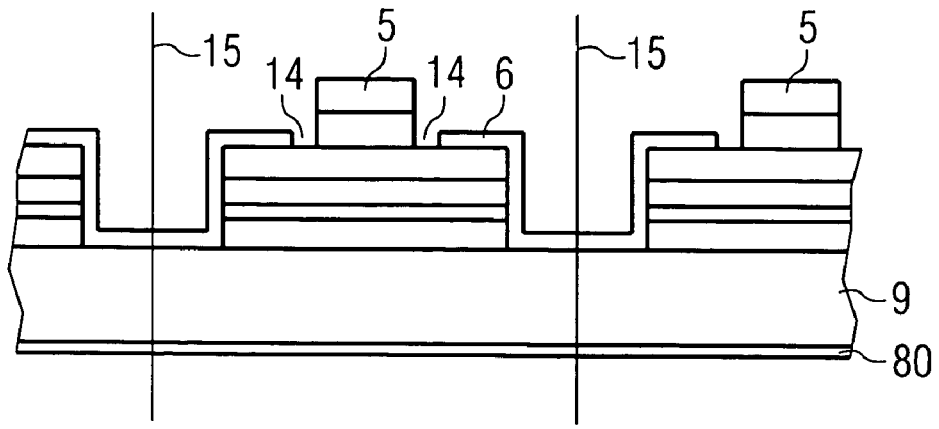

The resultant structure is illustrated schematically on the basis of a sectional view in FIG. 1G. The contact 5 is spaced apart from the protective layer 6, the spacing-apart being determined by the partial regions 14 that were formed during the removal of the protective layer in the contact region 14.

The assembly from FIG. 1G can be singulated into semiconductor components along the lines 15, for example by sawing, water jet cutting, laser separation or some other suitable method.

Prior to singulation, an electrically conductive counter-contact layer 80 may additionally be applied to that side of the carrier layer 9 which is remote from the semiconductor bodies, so that the semiconductor components can be electrically connected via the contact 5 and the counter-contact that emerges from the counter-contact layer 80 during singulation. For this purpose, the carrier layer 9 is advantageously doped in a corresponding manner, for example in an n-doped manner.

The risk of the protective layer chipping off from the semiconductor body when the contact 5 is connected to a bonding wire is reduced by virtue of the contact being spaced apart from the protective layer in the lateral direction, as illustrated in FIG. 1G. A comparatively smaller thickness of the protective layer compared with the thickness of the contact also contributes to reducing the risk of the protective layer chipping off from the semiconductor body.

The electrical isolation or separation of entire segments of the current expansion layer 4 from the contact due to large-area scratches is made more difficult on account of the comparatively small distance, for instance in the region of 2 μm, between contact and protective layer. The current that is to be impressed into the semiconductor body can flow around smaller scratches that arise in the partial regions 14 with the protective layer removed and, in an advantageous manner, said scratches do not critically reduce the efficiency of the semiconductor component.

Since the current expansion layer was protected against mask material residues by the protective layer during the application of the mask structure for the contact and thus has an untreated or undamaged surface compared with conventional components, it is possible to dispense with an additional contact layer, for instance made of Ti, that has an adhesion-promoting effect with respect to the current expansion layer.

Adhesion-promoting contact layers of this type can produce a sufficient mechanical or electrically conductive connection of the contact to the current expansion layer even in the case of surfaces that are comparatively unprotected during the processing, but are often so moisture-sensitive that they have to be protected in a complicated manner in order not to unnecessarily impair the contact properties over the service life of the semiconductor component. In conventional semiconductor components, for this purpose, the protective layer is often drawn as far as that side of the contact which is remote from the semiconductor body, but this has the disadvantages with regard to chipping off as mentioned in the introduction.

The invention furthermore makes it possible to avoid complicated and hazardous cleaning methods for the current expansion layer, in particular with regard to mask material residues.

Accordingly, in the case of the method according to an embodiment of the invention or the semiconductor components fabricated using the method, the protective layer 6 acts as passivation of the sidewalls of the semiconductor body, as an antiscratch layer for the current expansion layer and the semiconductor body, and as a barrier layer during fabrication which reduces to the greatest possible extent the risk of damage to the semiconductor body and the current expansion layer, in particular during the removal of the mask structure 11.

Figure 2:
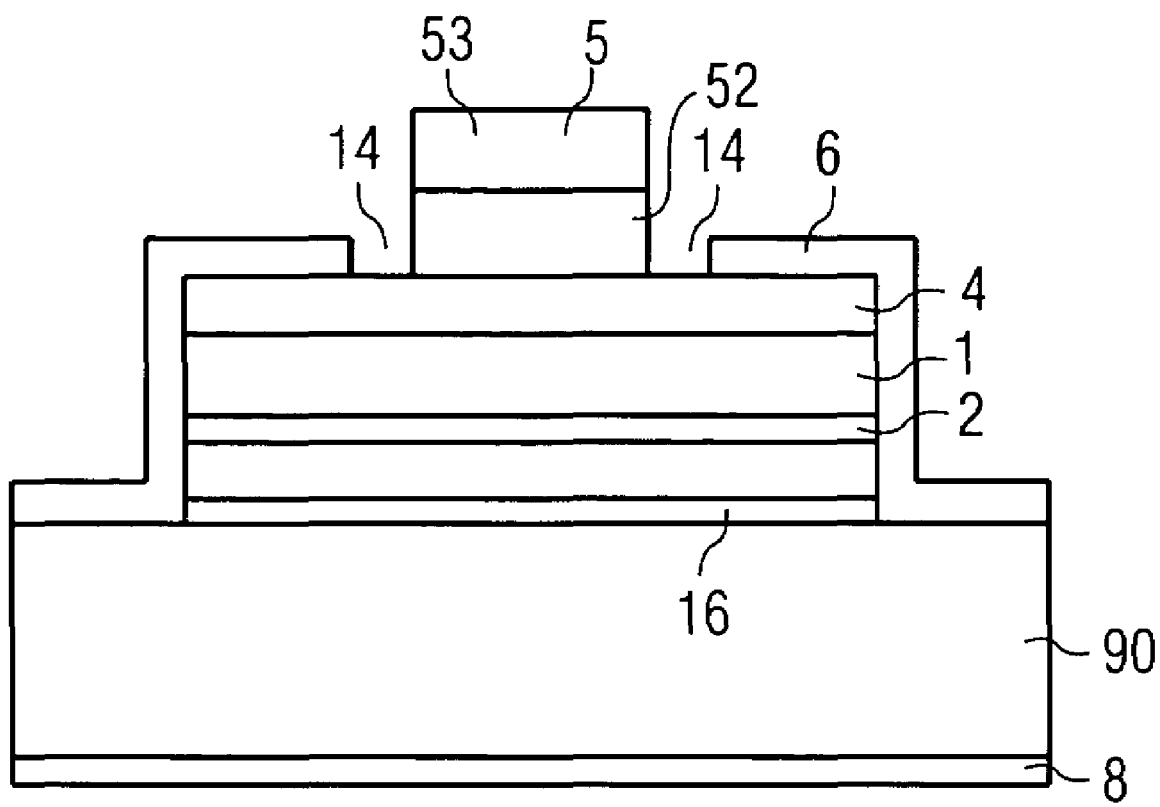
FIG. 2 shows a schematic sectional view of an exemplary embodiment of a radiation-emitting and/or -receiving semiconductor component according to the invention.

An exemplary embodiment of a radiation-emitting and/or -receiving semiconductor component according to the invention is illustrated schematically on the basis of a sectional view in FIG. 2. The structure of the semiconductor component essentially corresponds to the structure that emerges upon singulation from FIG. 1G.

In contrast to the structures outlined in FIG. 1G, in FIG. 2 a mirror layer 16 is arranged between the carrier 90 that is derived from the carrier layer 9 on singulation and the semiconductor body 1, which mirror layer may increase the efficiency of a semiconductor component according to the invention.

The mirror layer preferably contains a metal, for instance Au, Al, Ag, Pt or alloys with at least one of said materials. Au, for example, is distinguished by an advantageously high reflectivity in the red spectral region, while Al and Ag may also have a high reflectivity in the ultraviolet and blue spectral region.

In accordance with a refinement of the invention, the mirror layer is applied, in the wafer assembly, to the semiconductor layer sequence arranged on a first carrier layer, to that side of the semiconductor layer sequence which is remote from the first carrier layer. The first carrier layer preferably comprises the growth substrate of the semiconductor layer sequence. The application of the mirror layer may be effected for instance by sputtering or vapor deposition. After the application of the mirror layer, the assembly comprising first carrier layer and semiconductor layer sequence is arranged on a second carrier layer on the part of the mirror layer. This arrangement may be effected for example by means of a solder connection, an adhesive-bonding connection or a wafer bonding method. The first carrier layer of the semiconductor layer sequence can thereupon be stripped away from the semiconductor layer sequence. By way of example, laser-assisted methods, such as, for instance, a laser ablation method, mechanical methods, such as grinding, or etching methods are suitable for stripping.

In order to form the contact, it is possible to proceed in accordance with the method shown in FIG. 1A to 1G. However, a mirror layer 16 is now arranged between the—in this case second carrier layer 9—and the semiconductor layer sequence 100 in FIG. 1A. The semiconductor component can be connected via the contact 5 and the counter-contact 8 that is derived from the counter-contact layer 80 upon singulation.

Optoelectronic semiconductor chips fabricated with the growth substrate of the semiconductor layer sequence being stripped away are often also referred to as thin-film chips. The second carrier layer can be chosen comparatively freely compared with the growth substrate. Thus, with regard to some properties, such as, for instance, conductivity or stability, the second carrier layer may be better suited to semiconductor components than available growth substrates that are subject to comparatively tight restrictions for the fabrication of high-quality semiconductor layer sequences.

The second carrier layer, however, is preferably distinguished by a thermal coefficient of expansion that is adapted to the semiconductor layer sequence. By way of example, the second carrier layer may contain a semiconductor material, such as GaN, SiC, or a different type of material, for example sapphire. Metallic second carrier layers are also possible.

Semiconductor chips that are fabricated in this way and are provided for radiation generation may be distinguished, in particular with a metal-containing mirror layer, by an at least approximately cosinusoidal emission characteristic essentially corresponding to a Lambert radiator.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

We claim:

1. A method for the patterned application of a contact to a semiconductor body, which has an active zone intended for radiation generation, a lateral main direction of extent and a main area, such method comprising the steps of:
   a) forming the semiconductor body;
   b) applying a current expansion layer on the main area of the semiconductor body;
   c) applying a protective layer on the current expansion layer;
   d) forming a mask over the protective layer, a structure of said mask determining a lateral dimensioning of a contact region and the lateral dimensions of the contact;
   e) removing the protective layer in the contact region determined by the mask; and
   f) arranging at least one contact material for the contact in the contact region using the mask, said contact being laterally spaced apart from the protective layer.

2. The method as claimed in claim 1, wherein the protective layer is removed by wet-chemical etching in step e).

3. The method as claimed in claim 1, wherein the thickness of the current expansion layer is less than or equal to 50 nm.

4. The method as claimed in claim 1, wherein the thickness of the current expansion layer is equal to or greater than 1 nm.

5. The method as claimed in claim 1, wherein the protective layer is formed as an antiscratch layer for the current expansion layer.

6. The method as claimed in claim 1, wherein the semiconductor body comprises at least one III-V semiconductor material.

7. The method as claimed in claim 1, wherein the method forms the contact for at least one of a radiation-emitting component and receiving semiconductor component, such component comprising:

the semiconductor body, which includes the active zone intended for radiation generation, the lateral main direction of extent and the main area, and the protective layer arranged on the main area and the contact arranged on the main area, wherein the protective layer is spaced apart from the contact in the lateral direction.

8. The method as claimed in claim 6, wherein the active zone of the semiconductor body comprises the at least one III-V semiconductor material.

9. The method as claimed in claim 8, wherein the at least one III-V semiconductor material is from the semiconductor material systems $In_xGa_yAl_{1-x-y}P$, $In_xGa_yAl_{1-x-y}N$ or $In_xGa_yAl_{1-x-y}As$, where $0 \leq x \leq 1$, $0 \leq y \leq 1$ and $x + y \leq 1$.

10. The method as claimed in claim 1, wherein the current expansion layer comprises one of a metal, an alloy and a transparent conductive oxide material.

11. The method as claimed in claim 1, wherein the lateral spacing is less than or equal to 45 μm and greater than or equal to 0.5 μm.

* * * * *